(12) United States Patent
Ishida et al.

(10) Patent No.: US 8,287,760 B2
(45) Date of Patent: Oct. 16, 2012

(54) LIGHT-EMITTING APPARATUS, PHOSPHORESCENT PORTION, AND METHOD OF PRODUCING THE SAME

(75) Inventors: Masaya Ishida, Mihara (JP); Tatsuya Morioka, Ikoma (JP); Daisuke Hanaoka, Souraku-Gun (JP); Mototaka Taneya, Nara (JP); Shigeo Fujita, Kyoto (JP); Yoichi Kawakami, Kusatsu (JP); Masafumi Harada, Narashi (JP); Takatomo Sasaki, Suita (JP); Yusuke Mori, Katano (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 186 days.

(21) Appl. No.: 12/710,105

(22) Filed: Feb. 22, 2010

(65) Prior Publication Data

US 2010/0148120 A1      Jun. 17, 2010

Related U.S. Application Data

(62) Division of application No. 12/073,794, filed on Mar. 10, 2008, now Pat. No. 7,700,001, which is a division of application No. 11/402,926, filed on Apr. 13, 2006, now abandoned, which is a division of application No. 10/647,107, filed on Aug. 25, 2003, now Pat. No. 7,058,103.

(30) Foreign Application Priority Data

Aug. 23, 2002   (JP) ................................ 2002-243502

(51) Int. Cl.
   *F21K 2/00* (2006.01)
(52) U.S. Cl. .............. 252/301.4 R; 385/141; 359/341.5; 362/582

(58) Field of Classification Search ........... 252/301.4 R, 252/301.4 P; 977/815–820, 774; 427/215; 385/141; 362/582; 359/341.5
See application file for complete search history.

(56) References Cited

U.S. PATENT DOCUMENTS

| | | |
|---|---|---|
| 3,560,783 A | 2/1971 | Shortes |
| 3,891,886 A | 6/1975 | Woontner |
| 3,927,240 A | 12/1975 | Hammond et al. |
| 4,377,769 A | 3/1983 | Beatty et al. |

(Continued)

FOREIGN PATENT DOCUMENTS

JP     58-212034     12/1983

(Continued)

OTHER PUBLICATIONS (1975). *Optical Technology Handbook*, partial English translation. pp. 1112-1113.

(Continued)

*Primary Examiner* — Carol M Koslow
(74) *Attorney, Agent, or Firm* — Morrison & Foerster LLP

(57) ABSTRACT

A light-emitting apparatus composed of a light source that emits primary light and a phosphor that absorbs the primary light and emits secondary light offers high brightness, low power consumption, and a long lifetime while minimizing adverse effects on the environment. The phosphor is formed of a III-V group semiconductor in the form of fine-particle crystals each having a volume of 2 800 $nm^3$ or less. The light emitted from the fine-particle crystals depends on their volume, and therefore giving the fine-particle crystals a predetermined volume distribution makes it possible to adjust the wavelength range of the secondary light.

4 Claims, 9 Drawing Sheets

U.S. PATENT DOCUMENTS

| | | | |
|---|---|---|---|
| 5,244,750 A | 9/1993 | Reilly et al. | |
| 5,418,062 A | 5/1995 | Budd | |
| 5,455,489 A | 10/1995 | Bhargava | |
| 5,505,928 A | 4/1996 | Alivisatos et al. | |
| 6,077,458 A | 6/2000 | Shiiki et al. | |
| 6,236,060 B1 | 5/2001 | Chan et al. | |
| 6,306,736 B1 | 10/2001 | Alivisatos et al. | |
| 6,337,035 B1 | 1/2002 | Itoh et al. | |
| 6,447,908 B2 | 9/2002 | Yun et al. | |
| 6,544,732 B1 * | 4/2003 | Chee et al. | 435/6 |
| 6,734,466 B2 | 5/2004 | Chua | |
| 6,791,259 B1 | 9/2004 | Stokes et al. | |
| 6,794,265 B2 | 9/2004 | Lee et al. | |
| 6,803,719 B1 | 10/2004 | Miller et al. | |
| 6,890,777 B2 | 5/2005 | Bawendi et al. | |
| 6,977,182 B2 | 12/2005 | Sato et al. | |
| 7,022,260 B2 | 4/2006 | Morioka | |
| 7,058,103 B2 * | 6/2006 | Ishida et al. | 372/43.01 |
| 7,226,953 B1 | 6/2007 | Petruska et al. | |
| 7,326,365 B2 | 2/2008 | Bawendi et al. | |
| 7,700,001 B2 * | 4/2010 | Ishida et al. | 252/301.36 |
| 2002/0127224 A1 * | 9/2002 | Chen | 424/130.1 |
| 2002/0186921 A1 * | 12/2002 | Schumacher et al. | 385/31 |
| 2003/0044114 A1 * | 3/2003 | Pelka | 385/31 |
| 2004/0023010 A1 | 2/2004 | Bulovic et al. | |
| 2004/0105481 A1 | 6/2004 | Ishida et al. | |

FOREIGN PATENT DOCUMENTS

| | | |
|---|---|---|
| JP | 8-63119 | 3/1996 |
| JP | 11-340516 | 12/1999 |
| JP | 2001-184916 | 7/2001 |
| JP | 2001-196645 | 7/2001 |
| JP | 2002-118293 | 4/2002 |
| JP | 2002-232008 | 8/2002 |
| JP | 2003-25299 | 1/2003 |
| JP | 2004-51863 | 2/2004 |
| WO | WO 96/10282 * | 4/1996 |
| WO | WO-00/17655 | 3/2000 |
| WO | WO-03/084292 | 10/2003 |

OTHER PUBLICATIONS

Bhargava, R. N. (Jan. 17, 1994)."Optical Properties of Manganese-Doped Nanocrystals of ZnS." *Physical Review Letters.* 72(3):416-419.

Goodwin, T. (Jun. 9, 1997)."Synthesis of Gallium Nitride Quantum Dots Through Reactive Laser Ablation." *Applied Physics Letters.* 70(23):3122-3124.

Leppert, V. (Jun. 8, 1998). "Observation of Quantum Confined Excited States of GaN Nanocrystals." *Applied Physics Letters.* 72(23):3035-3037.

Nichols, W. (Feb. 19, 2001)."Large-Scale Production of Nanocrystals by laser ablation of Microparticles in a Flowing Aerosol." *Applied Physics Letters.* 78(8):1128-1130.

Perriere, J. (May 7, 2001). "Formation of GaAs Nanocrystals by Laser Ablation." *Applied Physics Letters.* 78(19):2949-2951.

Ishida, Masaya et al., U.S. Office Action mailed on Aug. 25, 2005, directed to U.S. Appl. No. 10/647,107; 7 pages.

Ishida, Masaya et al., U.S. Office Action mailed on May 7, 2007, directed to U.S. Appl. No. 11/402,926; 8 pages.

Ishida, Masaya et al., U.S. Office Action mailed on Dec. 10, 2007, directed to U.S. Appl. No. 11/402,926; 10 pages.

Ishida, Masaya et al., U.S. Office Action mailed on Dec. 30, 2008, directed to U.S. Appl. No. 12/073,794; 10 pages.

Ishida, Masaya et al., U.S. Office Action mailed on May 12, 2009, directed to U.S. Appl. No. 12/073,794; 9 pages.

Morioka, T.,U.S. Office Action mailed on Nov. 15, 2004, directed to U.S. Appl. No. 10/652,441; 8 pages.

Morioka, T.,U.S. Office Action mailed on Mar. 30, 2005, directed to U.S. Appl. No. 10/652,441; 8 pages.

Morioka, T.,U.S. Office Action mailed on Aug. 17, 2005, directed to U.S. Appl. No. 10/652,441; 6 pages.

* cited by examiner

PHOSPHORESCENCE EXIT

PRIMARY LIGHT ENTRANCE

LIGHT-EMITTING APPARATUS, PHOSPHORESCENT PORTION, AND METHOD OF PRODUCING THE SAME

REFERENCE TO RELATED APPLICATIONS

This application is a division of application Ser. No. 12/073,794, filed Mar. 10, 2008, now U.S. Pat. No. 7,700,001 which is a division of application Ser. No. 11/402,926, filed Apr. 13, 2006, now abandoned, which is a division of application Ser. No. 10/647,107, filed Aug. 25, 2003, now U.S. Pat. No. 7,058,103, which claims priority to Japanese Application No. 2002-243502 filed Aug. 23, 2002, the entire contents of which are herein incorporated by reference.

BACKGROUND OF THE INVENTION

1. Field of the Invention

The present invention relates to a light-emitting apparatus, and more particularly to a light-emitting apparatus that irradiates a phosphor with primary light emitted from a primary light source and that thereby produces secondary light having longer wavelengths than the primary light.

2. Description of the Prior Art

GaN-based semiconductors are direct-transition semiconductors with band gaps ranging from 0.9 eV or 1.8 eV to 6.2 eV, and thus they make it possible to realize light-emitting devices that emit light in a wide band ranging from visible to ultraviolet regions. For this reason, in recent years, GaN-based semiconductors have been receiving much attention and have been actively developed. The reason that the lower limit of the band gap is given as 0.9 eV or 1.8 eV above is that the band gap of InN has not yet been definitely determined between two theories that support 0.9 eV and 1.8 eV respectively.

As is widely practiced, such a GaN-based light-emitting device is used as an excitation light source to produce white light by mixing together phosphorescence of different colors emitted from red, green, and blue phosphors irradiated with light emitted from the GaN-based light-emitting device.

It has also been proposed to use a GaN-based light-emitting device in a full-color image display apparatus (Japanese Patent Application Laid-Open No. H8-63119). In this full-color image display apparatus, either phosphors each emitting phosphorescence of one of three primary colors, namely red, green, and blue, are excited by a GaN-based light-emitting diode array arranged on a substrate, or phosphors each emitting red or green phosphorescence are excited by a GaN-based light-emitting diode array and blue light is emitted directly from GaN-based light-emitting diodes.

On the other hand, next-generation light-emitting apparatuses are desired to offer high brightness combined with low power consumption. The brightness and power consumption of a light-emitting apparatus depend on the output power and quantum efficiency of its excitation light source and on the quantum efficiency of its phosphors. Thus, the phosphors are desired to have as high quantum efficiency as possible. Moreover, the resolution of a full-color display apparatus depends on the size of its pixels, and therefore, in a case where a phosphorescent surface is formed by applying a phosphorescent paint on a surface, it is necessary to reduce the size of the crystal particles of the phosphorescent material to suit the size of the pixels.

However, conventionally available phosphors have quantum efficiency of 10% or lower, and therefore, to obtain higher brightness, it is necessary to increase the light output power of the excitation light source. Inconveniently, this increases power consumption and shortens the lifetime of the excitation light source. For this reason, it has to date been difficult to realize a light-emitting apparatus that uses a GaN-based light-emitting device as an excitation light source and that offers high brightness combined with low power consumption and a long lifetime.

Recently, it has been observed that reducing the size of a crystal down to the exciton Bohr radius (hereinafter, such a crystal will be referred to as a "nano-crystal") causes, owing to the quantum size effect, trapping of excitons and an increase in the band gap (J. Chem. Phys., Vol. 80, No. 9, p. 1984). It has been reported that some semiconductors of such size exhibit photoluminescence with high quantum efficiency (Phys. Rev. Lett., Vol. 72, No. 3, p. 416, 1994; MRSbulletin Vol. 23, No. 2, p. 18, 1998; and U.S. Pat. No. 5,455,489).

Now, this effect will be described in the case of Mn-doped ZnS (ZnS:Mn), which is taken up as an example here for easy comparison because its light emission wavelength does not vary under the quantum size effect. Table 1 shows the results of comparison of the brightness of light emission obtained when ZnS:Mn nano-crystals having their surface treated with methacrylic acid and bulk ZnS:Mn particles having a particle size of 1 μm or greater were excited with the same ultraviolet lamp. Table 1 shows that the ZnS:Mn nano-crystals offer brightness close to five times the brightness offered by the bulk ZnS:Mn particles.

TABLE 1

|  | Nano-crystals | Bulk Particles |
|---|---|---|
| Brightness | 69 cd/m$^2$ | 14.2 cd/m$^2$ |

How this high quantum efficiency physically relates to the quantum size effect has not yet been definitely explained, but the possible factors that are considered to be involved include an increase in the intensity of excitons which results from the formation of electron-hole pairs, a decrease in the state density that does not contribute to light emission which results from the quantization of energy levels, a variation in the crystal field near the center of light emission which results from distortion of the crystal lattice, and surface treatment of the crystals. Which of these factors contributes effectively to light emission efficiency is not clear, but light emission efficiency has been reported to increase in crystals having sizes smaller than the exciton Bohr radius, which will be described below.

Here, the exciton Bohr radius indicates the extent of the probability of existence of excitons, and is given by $4\pi \in_0 h^2/me^2$ (where "$\in_0$" represents the low-frequency dielectric constant of the material, "h" represents the Planck constant, "m" represents the reduced mass obtained from the effective masses of an electron and a hole, and "e" represents the electric charge of an electron). For example, the exciton Bohr radius of ZnS is about 2 nm, and that of GaN is about 3 nm.

A most typical example of the quantum size effect is an increase in the band gap. FIG. 1 shows the dependence of the band gap on the crystal size as calculated on the basis of the theory by L. E. Brus et al. The intrinsic band gap of ZnS is about 3.5 eV, and therefore the quantum size effect is expected to increase in the range where the diameter is smaller than about 8 nm. This diameter is that of a crystal having a radius equal to twice the exciton Bohr radius.

Accordingly, by using a phosphor formed of crystals having a size equal to or smaller than twice the exciton Bohr radius, it is possible to exploit the contribution of the quantum size effect to light emission. That is, by varying the size of nano-crystals, it is possible to obtain different phosphorescence wavelengths. As nano-crystal materials having high quantum efficiency other than ZnS, there are actively being studied II-VI group materials such as CdSe.

Moreover, as shown in FIG. 2, a CdSe nano-crystal capped with ZnS has a quantum well structure, in which electron-hole pairs are strongly trapped inside the nano-crystal and thus undergo recombination. This material offers light emission efficiency higher by an order or more of magnitude than that of an uncapped CdSe nano-crystal, and offers quantum efficiency of about 50%.

A display apparatus and an illumination apparatus using a II-VI group nano-crystal material has been proposed (Japanese Patent Application Laid-Open No. H11-340516).

However, II-VI group materials have the following disadvantages. The result shown in Table 1 is that obtained when the nano-crystals were subjected to surface treatment using methacrylic acid. However, in crystals that are not subjected to surface treatment, excited electrons are captured by the dangling bond of ions existing on the surface and undergo non-radiation recombination. This greatly reduces light emission intensity. For example, as shown in Table 2, in ZnS:Mn nano-crystals of which the surface is not treated with methacrylic acid, the dangling bond on the surface of the crystals is not effectively terminated, with the result that the light emission intensity of these nano-crystals is far lower than that of the sample of which the surface is treated. Thus, II-VI group nano-crystals require a special process to stabilize its surface.

TABLE 2

| Surface Treatment | Methacrylic Acid | No |
|---|---|---|
| Brightness | 69 cd/m$^2$ | 9.4 cd/m$^2$ |

Moreover, II-VI group materials contain toxic substances such as Cd and Se, and therefore using II-VI group materials in light-emitting apparatuses and image display apparatuses is a matter of great concern from the environmental perspective.

SUMMARY OF THE INVENTION

An object of the present invention is to provide a light-emitting apparatus that uses a stable, environmentally friendly material and that offers high brightness combined with low power consumption and a long lifetime.

To achieve the above object, the inventors of the present invention studied the use of nano-crystals of a III-V group nitride compound semiconductor, which is stable as a material and which has minimum adverse effects on the environment.

A description will be given of a case where InN nano-crystals are used as a phosphor. The intrinsic band gap of InN at room temperature is 0.9 eV or 1.8 eV. However, when the size of the crystals is reduced to about 14 nm along each side, the band gap increases under the quantum size effect. The dielectric constant of InN is unknown, and therefore the Bohr radius of InN is unknown. On the other hand, GaN is known to have a Bohr radius of 3 nm, and therefore InN is considered to have a Bohr radius not greatly different therefrom. Thus, the quantum effect is considered to appear at a particle size about twice that Bohr radius The surface of this phosphor is stable, and offers high quantum efficiency without special surface treatment. Moreover, the elements that the phosphor contains are mostly III group elements and nitrogen; that is, it contains no toxic elements, an advantage from the environmental perspective.

Moreover, the half width of the phosphorescence of InN nano-crystals is about 20 nm, which is extremely narrow as compared with that of a common bulk phosphor, for example 60 nm of ZnS:Ag. This helps realize light-emitting apparatuses and image display apparatuses with high color quality.

Moreover, by reducing the crystal size of InN, it is possible to realize not only red but also green and blue phosphors with InN nano-crystals. Thus, it is possible to obtain phosphorescence covering from red to blue with a single material, and thus to realize a full-color display or the like with a single phosphorescent ingredient.

Furthermore, by laying a red phosphor, a green phosphor, and a blue phosphor, each formed of nano-crystals as described above, over one another in this order from the side closer to an excitation light source, it is possible to obtain white phosphorescence. By exciting the so produced white phosphorescent portion with the light emitted from a GaN-based light-emitting device, it is possible to realize an illumination apparatus that emits white light.

As described above, extremely high quantum efficiency is obtained with some phosphors that are formed of fine crystals, i.e., nano-crystals, of a III group nitride compound semiconductor which are so fine as to exhibit the quantum size effect. By exciting such a phosphor with a light-emitting device that emits light of wavelengths in the range from 380 nm to 500 nm, it is possible to realize efficient display apparatuses and illumination apparatuses.

The reason that the excitation wavelength is limited within the range from 380 nm to 500 nm is that, with a III group nitride compound semiconductor, it is difficult to produce a high-efficiency laser or light-emitting diode (LED) that emits light of wavelengths of 380 nm or shorter, and that it is impossible to obtain blue phosphorescence with excitation light of wavelengths of 500 nm or longer.

The studies described above have led to the present invention, according to which a light-emitting apparatus provided with a light source that emits primary light and a phosphor that absorbs at least part of the primary light emitted from the light source and emits secondary light having a longer peak wavelength than the primary light is characterized in that the phosphor is formed of fine-particle crystals of a III-V group compound semiconductor, and that the fine-particle crystals each either have a volume of 2 800 nm$^3$ or less and measure 14 nm or less in two directions perpendicular to the longest side thereof.

The invention provides a method of a producing phosphor for the core of an optical fiber. The method includes a step of synthesizing nano-crystals of a first III-V group compound semiconductor and a step of synthesizing, on the first III-V group compound semiconductor, a second III-V group compound semiconductor having different composition from the first III-V group compound semiconductor for making nano-crystals having a quantum well structure. The invention also provides a phosphor for the core of an optical fiber. The phosphor has a quantum well structure made by a second III-V group compound semiconductor synthesized on nano-crystals of a first III-V group compound semiconductor having a different composition from the second III-V group compound semiconductor.

Preferably, the fine-particle crystals of the III-V group compound semiconductor (i.e., the nano-crystal phosphor) are given a multilayer structure as shown in FIG. 2 where a portion having a small energy band gap is surrounded with a portion having a great energy band gap.

Typically, the light source that emits the primary light is realized with one or more nitride-based III-V group compound semiconductor light-emitting devices, and these may be arranged in a one- or two-dimensional array.

Typically, these light-emitting devices are formed by growing a nitride-based III-V group compound semiconductor on a substrate such as a nitride-based III-V group semiconductor substrate, sapphire substrate, SiC substrate, or ZnO substrate.

Preferably, the phosphor is fainted of a III-V group compound semiconductor containing at least one III group element selected from the group consisting of Ga, Al, In, and B and at least one V group element including always N and in addition As or P as the case may be. It is particularly preferable that 50% or more of the III group elements be In and that 95% or more of the V group elements be nitrogen.

Preferably, the phosphor is formed of a III-V group compound semiconductor containing at least one III group element selected from the group consisting of Ga, Al, In, and B and at least one V group element including always N and in addition As or P as the case may be. It is particularly preferable that 50% or more of the III group elements be In and that 95% or more of the V group elements be nitrogen.

In a light-emitting apparatus structured as described above according to the present invention, a phosphor is formed of crystals having a particle diameter equal to or smaller than twice the exciton Bohr radius. Thus, by exciting this phosphor with light emitted from a light-emitting device using a nitride-based III-V group compound semiconductor, it is possible to enhance the quantum efficiency of the phosphor. Moreover, the small size of the crystals forming the phosphor makes it possible to obtain high resolution.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Figure 3A:
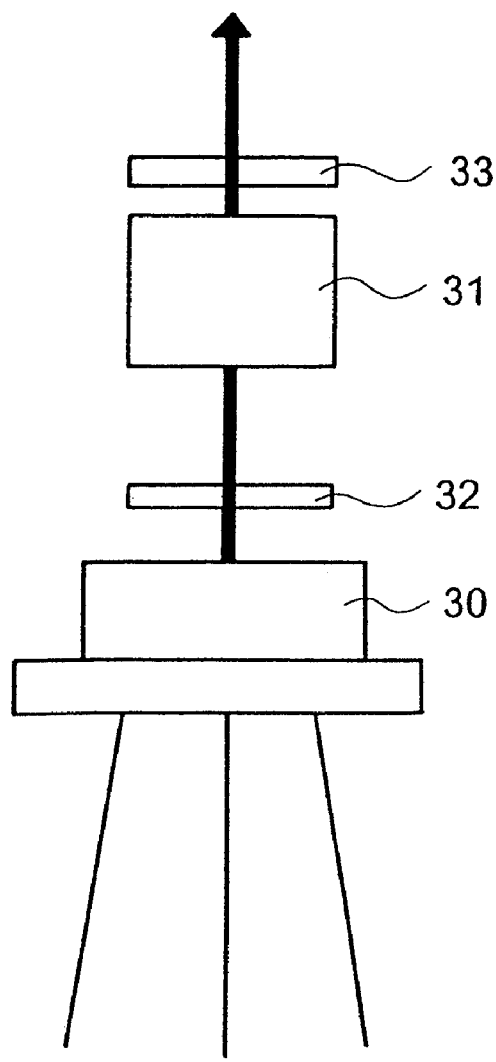
FIGS. 3A and 3B are diagrams schematically showing an example of the structure of a light-emitting apparatus embodying the invention.
Figure 3B:
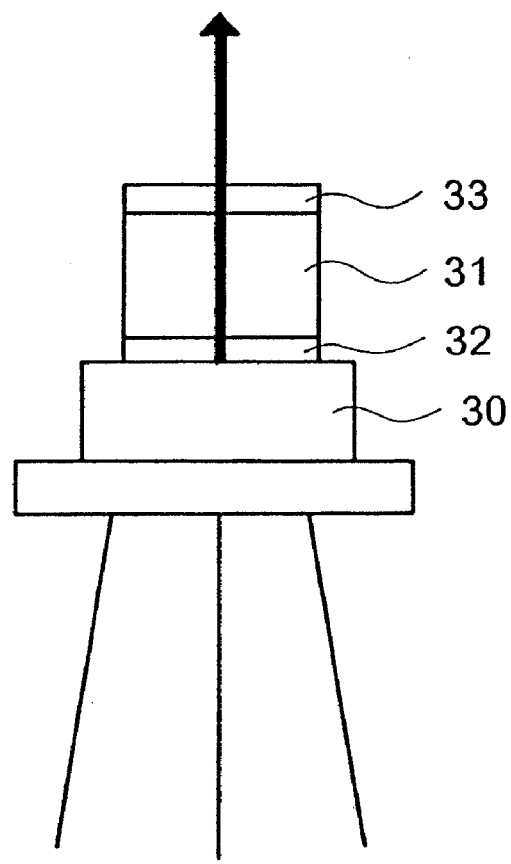

Hereinafter, light-emitting apparatuses embodying the present invention will be described with reference to the drawings. In the embodiments described hereinafter, used as a primary light source is a III-V group nitride semiconductor laser (hereinafter also referred to simply as a "laser") or a light-emitting diode (LED). To form a phosphorescent portion, fine-particle crystals of a III-V group compound semiconductor are dispersed in resin. In one light-emitting apparatus embodying the invention, as shown in FIGS. 3A and 3B, a laser 30 is used as a primary light source in combination with a phosphorescent portion 31. In that case, between the laser 30 and the phosphorescent portion 31, there is inserted a wavelength filter 32 that absorbs or reflects light of wavelengths shorter than 395 nm.

Moreover, in front of the phosphorescent portion 31 (on the exit side thereof), there is disposed a wavelength filter 33 that absorbs or reflects only the excitation laser light (the primary light emitted from the laser 30). The laser 30 emits laser light of wavelengths in the range from 380 nm to 500 nm. In a case where the phosphorescent portion is composed of fine-particle crystals and resin, it is preferable that the laser have wavelengths in the range from 395 nm to 500 nm. The phosphorescent portion 31, when excited with the laser light emitted from the laser 30, emits phosphorescence in the visible light region.

Figure 4:
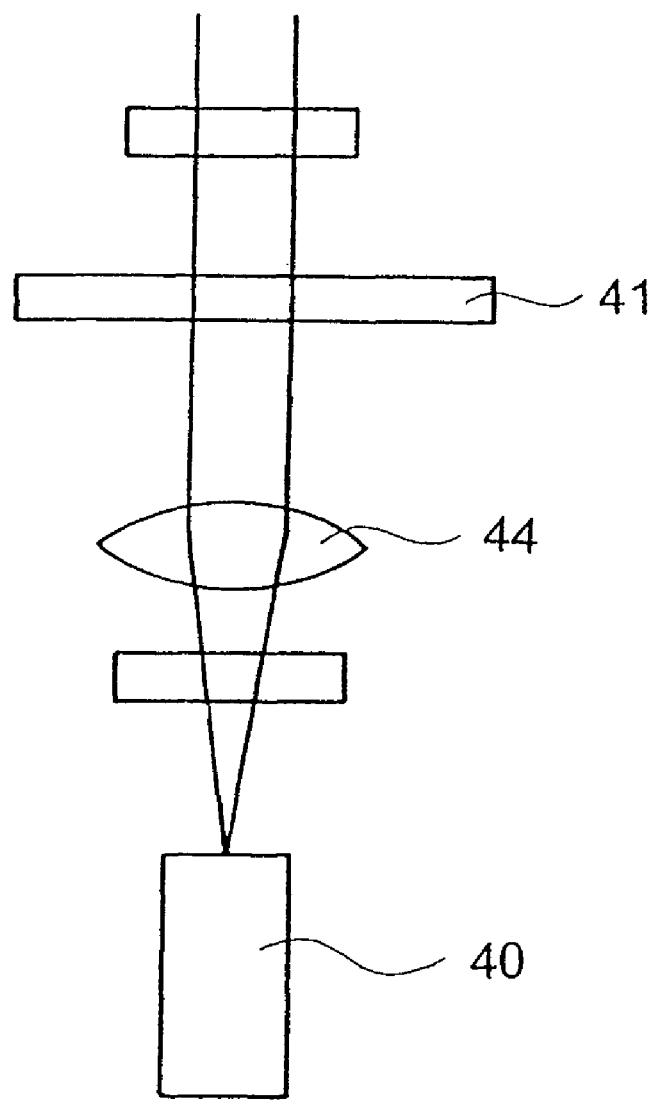
FIG. 4 is a diagram schematically showing another example of the structure of a light-emitting apparatus embodying the invention.

As shown in FIGS. 3A and 3B, the laser 30 and the phosphorescent portion 31 may be arranged in close contact with each other, or may be arranged apart from each other. The phosphorescent portion 31 is arranged so as to face the laser 30 so that the former can receive the laser light emitted from the latter. As shown in FIG. 3A, the laser light may be shone on glass or resin, such as acrylic resin, in which fine-particle crystals of a III-V group compound semiconductor are dispersed, or may be shone on a surface to which a phosphorescent paint is applied or on which a coating thereof is formed. The phosphorescent portion may even be given a shape like a sphere or optical fiber so as to achieve good optical coupling with the laser light. As shown in FIG. 4, an optical system such as a lens 44 may be disposed between a primary light source 40 and a phosphorescent portion 41.

Figure 5:
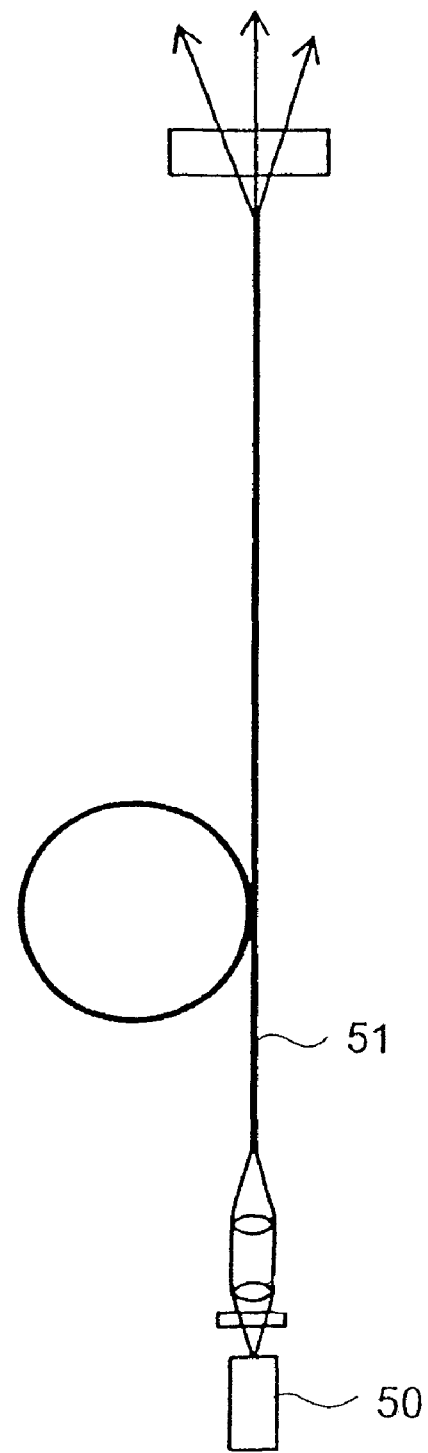
FIG. 5 is a diagram schematically showing another example of the structure of a light-emitting apparatus embodying the invention.
Figure 6:
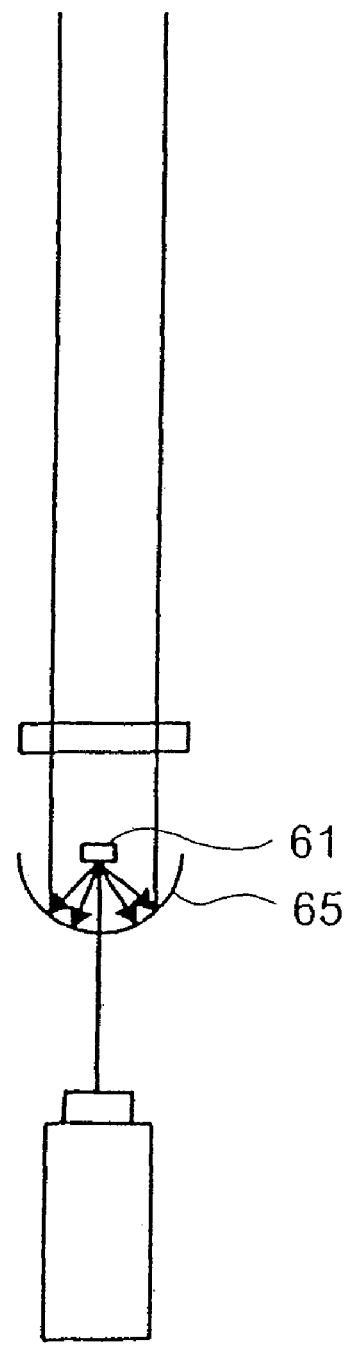
FIG. 6 is a diagram schematically showing another example of the structure of a light-emitting apparatus embodying the invention.
Figure 7:
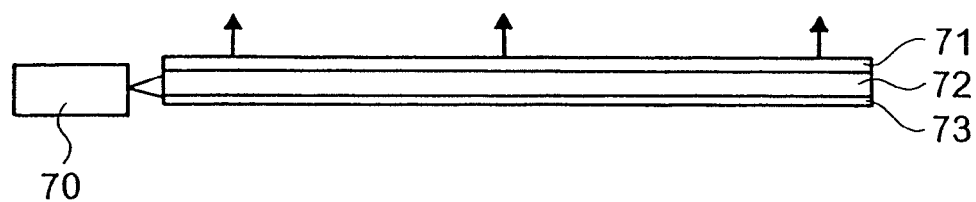
FIG. 7 is a diagram schematically showing another example of the structure of a light-emitting apparatus embodying the invention.

As shown in FIG. 5, a primary light source 50 may be coupled with the core of an optical fiber 51 in which fine-particle crystals of a III-V group compound semiconductor are dispersed. As shown in FIG. 6, the phosphorescence from a phosphorescent portion 61 may be condensed with a concave surface mirror 65. As shown in FIG. 7, a light-emitting apparatus may be so structured that a laser used as a primary light source 70 is coupled with a light guide plate 72 and a scattering plate 73 so that primary light is extracted perpendicularly to the light guide plate 72, and that a phosphorescent portion 71 is disposed at where the extracted primary light is directed so that secondary light is obtained as surface-emission phosphorescence.

The laser may be of any type so long as it emits laser light of wavelengths in the range from 380 to 500 nm. In a case where the phosphorescent portion is composed of fine-particle crystals and resin, it is preferable that the laser have wavelengths in the range from 395 to 500 nm, because irradiating the resin with light of wavelengths shorter than 395 nm causes deterioration of the resin. For this reason, it is preferable to dispose, between the laser and the phosphorescent portion, a wavelength filter or the like that absorbs or reflects spontaneous emission light of wavelengths shorter than 395 nm included in the light emitted from the laser.

Examples of the laser include a surface-emission-type device, a stripe-shaped device, and a laser array having devices of either type arranged in an array.

Part of the laser light may be transmitted through the phosphorescent portion so as to be used along with the phosphorescence. However, in a case where a light-emitting apparatus embodying the invention is used for illumination purposes, letting laser light out to the outside world is undesirable because of its adverse effects on the human body. Thus, in such a case, it is preferable to make the phosphorescent portion absorb all the laser light, or to use a wavelength filter or the like to keep the laser light from getting out to the outside world.

Preferable examples of the phosphor include one sintered, one applied to a plate-shaped member of a transparent material such as quartz, one dispersed in a glass-like substance such as glass or acrylic resin and then hardened, cut, and formed into a spherical, cylindrical, or fiber-like shape.

In a case where, as shown in FIG. 3A, a laser 30 and a phosphorescent portion 31 are arranged apart from each other, the phosphorescent portion is a single member or component. In this case, the phosphorescent portion 31 is, for example, a transparent member to which a phosphorescent paint is applied or on which a coating thereof is formed, or a glass member having phosphor dispersed therein, and this phosphorescent portion 31 is used in combination with a laser device.

Figure 8:
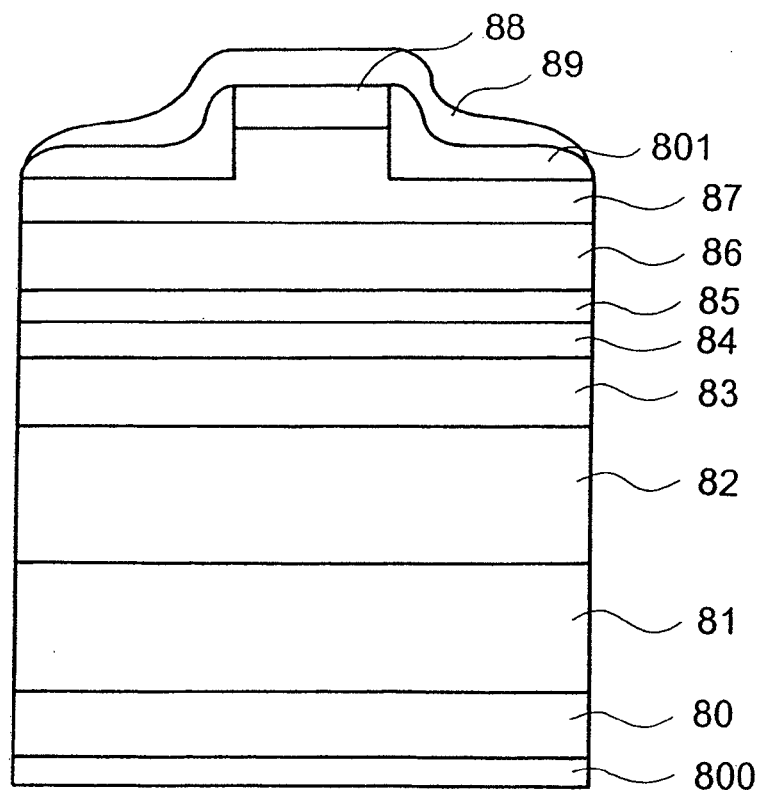
FIG. 8 is a sectional view schematically showing an example of the structure of the laser used as the primary light source in a light-emitting apparatus embodying the invention.

FIG. 8 shows an example of the laser 30 used in the light-emitting apparatus shown in FIG. 3A. The GaN-based semiconductor laser 30 shown in this figure has a ridge structure, and has a cavity formed with an active layer 84 cleaved at both ends so as to resonate and emit laser light parallel to the active layer 84. Thus, the laser light oscillates in the direction perpendicular to the plane of the figure, and then exits from the laser 30 to strike the phosphorescent portion 31, causing it to emit phosphorescence to the outside world.

The laser 30 shown in FIG. 8 has, on top of a crystal substrate (for example, a GaN crystal substrate) 80, an n-GaN contact layer 81, an n-AlGaN clad layer 82, an n-GaN guide layer 83, an InGaN active layer 84, a p-AlGaN evaporation prevention layer 85, a p-GaN guide layer 86, a p-AlGaN clad layer 87, and a p-GaN contact layer 88 laid on one another. On the top and bottom of these layers are formed a p-type electrode 89 and an n-type electrode 800, respectively, and a SiO$_2$ layer 801 insulates the p-type electrode 89 from the p-AlGaN clad layer 87 except in the ridge portion. As the primary light source, it is also possible to use a surface-emission laser or an LED.

As the crystal substrate of the device used as the primary light source, it is possible to use any conventionally known substrate other than GaN so long as it permits growth of a GaN-based crystal thereon. Examples of such a crystal substrate include sapphire, SiC, Si, and quartz.

Light emission may be achieved with any structure so long as it is suitable for a laser to emit light and oscillate and for an LED to emit light. Examples of suitable structures include a double hetero junction structure, a structure including a SQW (single quantum well), one including a MQW (multiple quantum well), and one including a quantum dot. With an LED, examples of suitable structures further include a simple pn-junction formed between two layers as a homo- or hetero-junction.

Hereinafter, practical examples of the present invention will be presented.

EXAMPLE 1

A light-emitting apparatus structured as shown in FIG. 3A was fabricated.
Primary Light Source In this example, a stripe laser structured as shown in FIG. 8, i.e., one having a ridge structure, was fabricated as the primary light source. In the following description, the values given in cm$^{-3}$ are carrier densities.
Laser As shown in FIG. 8, on top of a GaN substrate 80, an n-GaN contact layer 81 (3 μm thick, 1×10$^{18}$ cm$^{-3}$), an n-Al$_{0.1}$Ga$_{0.9}$N clad layer 82 (1 μm thick, 1×10$^{18}$ cm$^{-3}$), an n-GaN guide layer 83 (0.1 μm thick, 1×10$^{18}$ cm$^{-3}$), an In$_{0.15}$Ga$_{0.85}$N/In$_{0.05}$Ga$_{0.95}$N 3MQW active layer 84, a p-Al$_{0.15}$Ga$_{0.85}$N evaporation prevention layer 85 (0.02 μm thick, 1×10$^{18}$ cm$^{-3}$), a p-GaN guide layer 86 (0.1 μm thick, 1×10$^{18}$ cm$^{-3}$), a p-Al$_{0.1}$Ga$_{0.9}$N clad layer 87 (0.6 μm thick, 1×10$^{18}$ cm$^{-3}$), and a p-GaN contact layer 88 (0.1 μm thick, 1×10$^{18}$ cm$^{-3}$) were laid on one another.

Next, by RIE, this multilayer structure was partially etched from the top surface thereof so that the p-AlGaN clad layer 87 was exposed except for a portion thereof. Then, on top, a SiO$_2$ (0.3 μm) layer 801 was laid, and, further on top, a p-type electrode 89 (Pd/Mo/Au) was formed. Moreover, on the bottom surface of the multilayer structure, an n-type electrode 800 (Ti/Al) was formed. The oscillation wavelength of the apparatus was 405 nm.
Phosphorescent Portion InN nano-crystals having volumes of 8 nm$^3$ to 1 000 nm$^3$ (2 nm to 10 nm along each side) were synthesized through chemical synthesis, and then, by a process, acrylic resin having the InN nano-crystals dispersed therein was formed into a film (3 μm thick). The reason that the volume varied from 8 nm$^3$ to 1 000 nm$^3$ (2 nm to 10 nm along each side) was that the volume that produced the same phosphorescence wavelength varied according to the conditions of synthesis.
Evaluation When the laser of the above light-emitting apparatus was energized to cause laser oscillation, phosphorescence of a wavelength 635 nm was obtained with energy conversion efficiency of 80 [lm/W]. Assuming that the length of time over which the energy conversion efficiency fell half its initial value was the lifetime, the lifetime was about 10 000 hours.

For comparison, the above light-emitting apparatus was operated with the wavelength filter 32 shown in FIG. 3A removed. In this case, the lifetime, over which the energy conversion efficiency fell half its initial value, was 1 000 hours.

EXAMPLE 2

Figure 1:
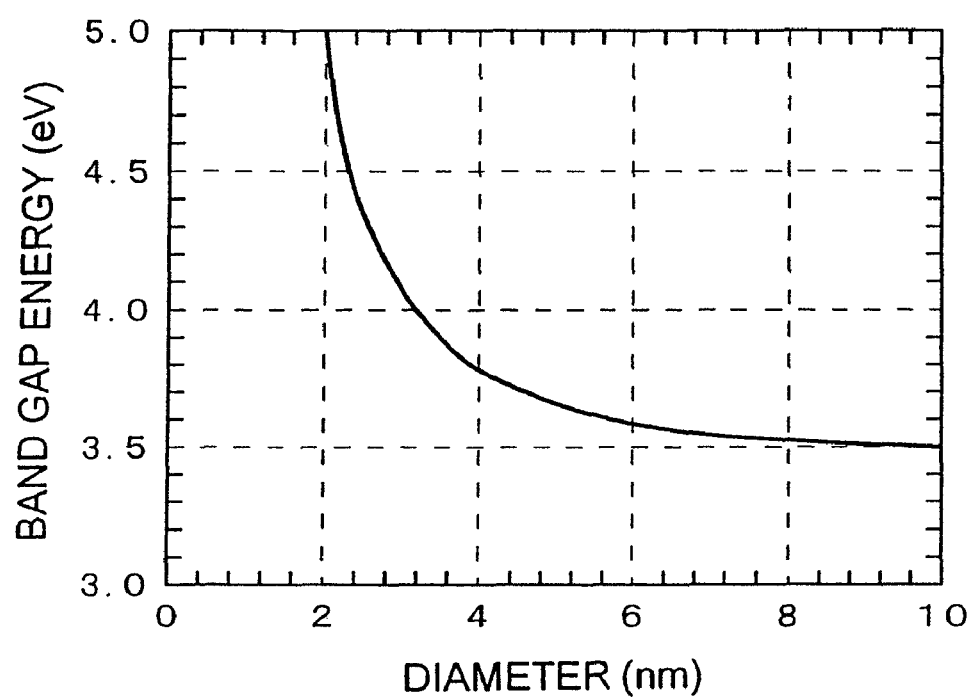
FIG. 1 is a graph showing the dependence of the band gap energy of ZnS on the crystal size.
Figure 2:
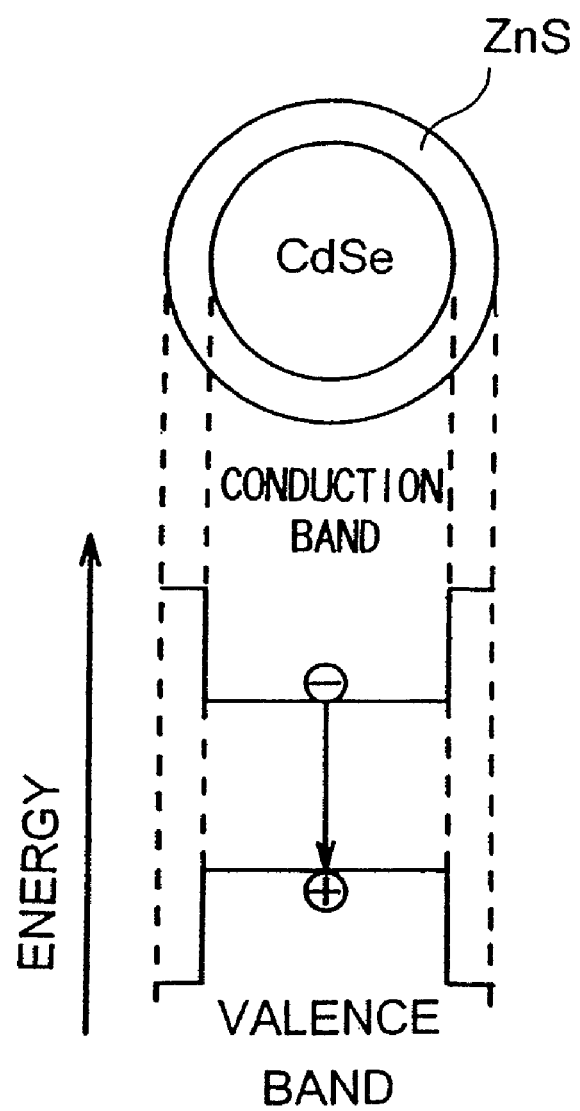
FIG. 2 is a sectional view showing a quantum dot of CdSe combined with an energy band diagram thereof.

A light-emitting apparatus structured as shown in FIG. 3B was fabricated.
Primary Light Source As the primary light source, the same laser as used in Example 1 was used.
Phosphorescent Portion InN nano-crystals having volumes of 3.375 nm$^3$ to 64 nm$^3$ (1.5 nm to 4 nm along each side) were grown by laser ablation, and then, on top of the InN, GaN was grown by laser ablation in a similar manner to produce InN/GaN nano-crystals having a quantum well structure as shown in FIG. 2. Then, acrylic resin having these nano-crystals dispersed therein was formed into a cylindrical shape. The reason that the volume varied from 3.375 nm$^3$ to 64 nm$^3$ (1.5 nm to 4 nm along each side) was that the volume that produced the same phosphorescence wavelength varied according to the conditions of growth.

Evaluation

When the laser of the above light-emitting apparatus was energized to cause laser oscillation, phosphorescence of a wavelength 520 nm was obtained with energy conversion efficiency of 120 [lm/W].

Figure 9:
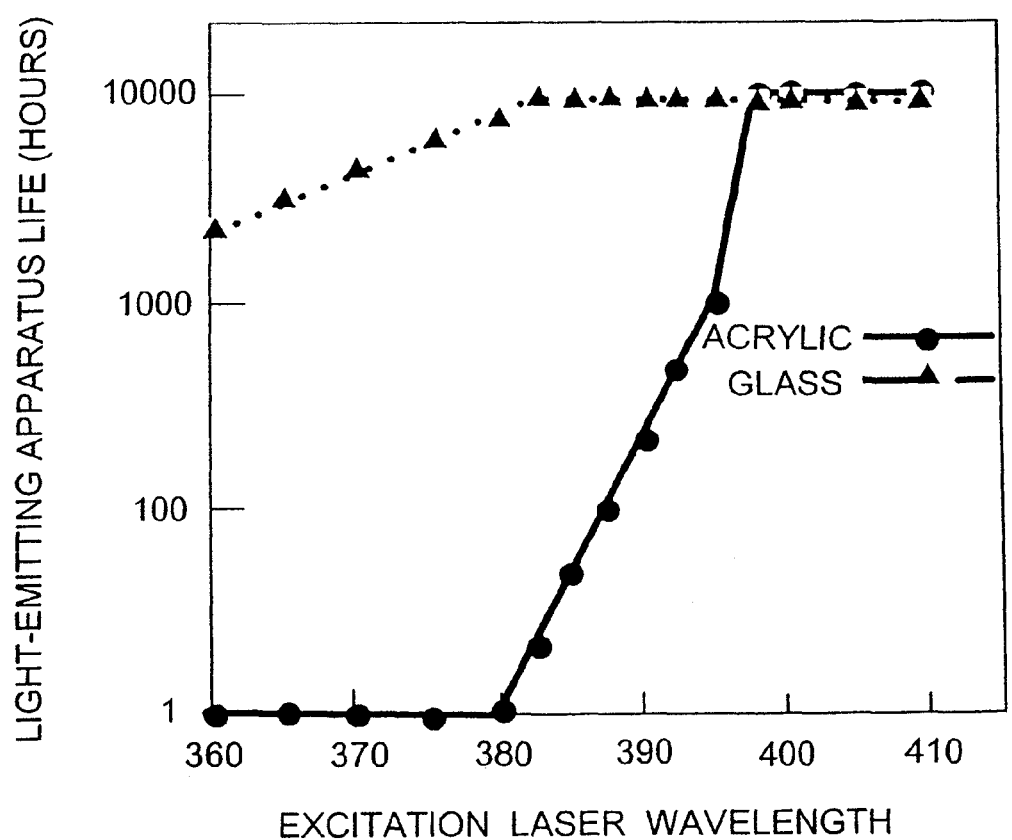
FIG. 9 is a diagram showing the correlation between the oscillation wavelength of the laser used as the primary light source in a light-emitting apparatus embodying the invention and the lifetime of the light-emitting apparatus.

For comparison, a laser that oscillated at a different wavelength was produced and used as the excitation light source, and the correlation between the wavelength of the excitation light source and the lifetime, over which the energy conversion efficiency fell to half its initial value, was evaluated. Used as the wavelength filter 32 was one that absorbed or reflected spontaneous emission light of wavelengths shorter than the oscillation wavelength. FIG. 9 shows the relationship between the wavelength and the life time, over which the energy conversion efficiency fell to half its initial value. With glass resin, the lifetime decreased as the wavelength shortened below 380 nm; with acrylic resin, the lifetime decreased as the wavelength shortened below 395 nm. This decrease in the lifetime was due to, with glass resin, the deterioration of the laser used as the excitation light source and, with acrylic resin, the deterioration of the acrylic resin.

EXAMPLE 3

A light-emitting apparatus structured as shown in FIG. 4 was fabricated.

Primary Light Source

Figure 10:
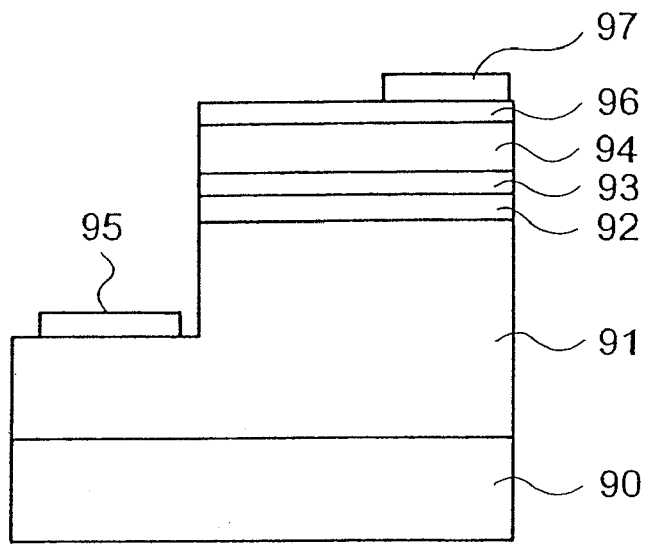
FIG. 10 is a sectional view schematically showing an example of the structure of the LED used as the primary light source in a light-emitting apparatus embodying the invention.

In this example, an LED structured as shown in FIG. 10 was fabricated. In the following description, the values given in cm$^{-3}$ are carrier densities.

Laser

As shown in FIG. 10, on top of a sapphire substrate 90, a buffer layer (not shown) was grown, and then an n-GaN contact layer 91 (3 µm thick, 1×10$^{18}$ cm$^{-3}$), an In$_{0.12}$Ga$_{0.87}$N/GaN 5MQW active layer 92, a p-Al$_{0.15}$Ga$_{0.85}$N evaporation prevention layer 93 (0.02 µm thick, 1×10$^{18}$ cm$^{-3}$), a p-GaN contact layer 94 (0.2 µm thick, 1×10$^{18}$ cm$^{-3}$) were laid on one another. Next, by RIE, this multilayer structure was partially etched from the top surface thereof so that the n-GaN contact layer 91 was exposed except for a portion thereof. Then, on top, an n-type electrode 95 (Ti/Al) was formed. Moreover, on top of the p-GaN contact layer 94, a p-type transparent electrode 96 (Pd; 0.008 nm) was formed, and on top of a portion thereof, a p-type electrode 97 (Pd/Mo/Au) was formed.

Phosphorescent Portion

Figure 11:
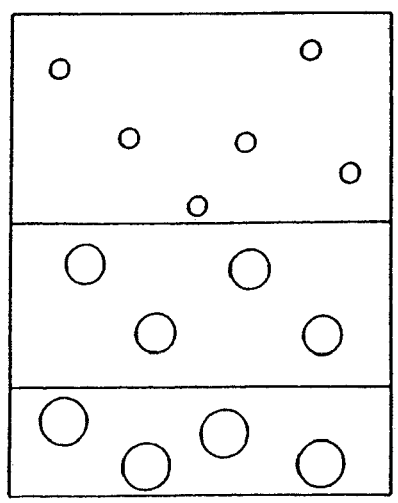
FIG. 11 is a sectional view schematically showing an example of a phosphorescent portion having a multilayer structure for use in a light-emitting apparatus embodying the invention.

Three types of InN nano-crystals were produced by laser ablation, namely those having volumes of 8 nm$^3$ to 27 nm$^3$ (2 nm to 3 nm along each side), those having volumes of 10.7 nm$^3$ to 64 nm$^3$ (2.2 nm to 4 nm along each side), and those having volumes of 17.6 nm$^3$ to 512 nm$^3$ (2.6 nm to 8 nm along each side). Then, as shown in FIG. 11, these three types of nano-crystals were dispersed in acrylic resin in three layers in such a way that the size of the InN nano-crystals decreases from the entrance side to the exit side of the primary light. The thicknesses of these three layers were, with consideration given to how each layer absorbed the primary light, so adjusted that the phosphorescence emitted from the individual layers and mixed together was white.

Evaluation

When the LED of the above light-emitting apparatus was energized to emit light, white light was obtained with energy conversion efficiency of 60 [lm/W].

EXAMPLE 4

A light-emitting apparatus structured as shown in FIG. 5 was fabricated.

Primary Light Source

As the primary light source, a stripe laser of an embedded type was used.

Phosphorescent Portion

In$_{0.95}$Ga$_{0.05}$N nano-crystals having volumes of 125 nm$^3$ to 343 nm$^3$ (5 nm to 7 nm along each side) were synthesized through chemical synthesis, and on the InGaN, AlN was synthesized through chemical synthesis in a similar manner to produce In$_{0.95}$Ga$_{0.05}$N/AlN nano-crystals having a quantum well structure as shown in FIG. 2. Then, an optical fiber was produced of which the core had these nano-crystals dispersed therein.

Evaluation

When the laser of the above light-emitting apparatus was energized to cause laser oscillation, phosphorescence of a wavelength 600 nm was obtained with energy conversion efficiency of 120 [lm/W].

EXAMPLE 5

A light-emitting apparatus structured as shown in FIG. 6 was fabricated.

Primary Light Source

As the primary light source, a surface-emission laser was used.

Phosphorescent Portion

In$_{0.98}$Ga$_{0.02}$N$_{0.99}$P$_{0.01}$ nano-crystals having volumes of 343 nm$^3$ to 512 nm$^3$ (7 nm to 8 nm along each side) were synthesized through chemical synthesis, and then, by a process, glass having the InGaNP nano-crystals dispersed therein was formed into a film (1 mm thick).

Evaluation

When the laser of the above light-emitting apparatus was energized to cause laser oscillation, phosphorescence of a wavelength 560 nm was obtained with energy conversion efficiency of 100 [lm/W].

EXAMPLE 6

A light-emitting apparatus structured as shown in FIG. 7 was fabricated.

Primary Light Source

As the primary light source, the same laser as used in Example 1 was used.

Phosphorescent Portion

InN nano-crystals having volumes of 343 nm$^3$ to 1 000 nm$^3$ (7 nm to 10 nm along each side) were synthesized through chemical synthesis, and then, by a process, a glass film (10 µm thick) having the InN nano-crystals dispersed therein was formed on a light guide plate.

Evaluation

When the laser of the above light-emitting apparatus was energized to cause laser oscillation, phosphorescence of a wavelength 550 nm was obtained with energy conversion efficiency of 100 [lm/W].

Obviously, many modifications and variations of the present invention are possible in light of the above teachings.

It is therefore to be understood that within the scope of the appended claims, the invention may be practiced other than as specifically described.

What is claimed is:

1. An optical fiber, comprising:
   a core; and
   a phosphor dispersed in the core, the phosphor comprising nano-crystals having a quantum well structure made by GaN synthesized on nano-crystals of InN, the phosphor receiving light of a first wavelength in a range from 380 nm to 500 nm and emitting light of a second wavelength longer than the first wavelength.

2. The optical fiber according to claim 1, wherein the synthesizing is performed through chemical synthesis.

3. The optical fiber according to claim 1, wherein the synthesizing is performed by laser ablation.

4. A method of producing an optical fiber, comprising:
   synthesizing $In_{0.95}Ga_{0.05}N$ nano-crystals having volumes of 125 $nm^3$ to 343 $nm^3$ through chemical synthesis;
   synthesizing an AlN layer on the $In_{0.95}Ga_{0.05}N$ nano-crystals through chemical synthesis to produce $In_{0.95}Ga_{0.05}N$/AlN nano-crystals having a quantum well structure; and
   forming an optical fiber comprising the $In_{0.95}Ga_{0.05}N$/AlN nano-crystals dispersed in a core thereof.

* * * * *